(12) United States Patent
Malone

(10) Patent No.: US 7,843,643 B2
(45) Date of Patent: Nov. 30, 2010

(54) LAMINATED MICROMIRROR PACKAGE

(75) Inventor: Joshua J. Malone, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/046,008

(22) Filed: Mar. 11, 2008

(65) Prior Publication Data

US 2008/0158519 A1  Jul. 3, 2008

Related U.S. Application Data

(62) Division of application No. 11/159,486, filed on Jun. 23, 2005, now Pat. No. 7,345,807, which is a division of application No. 10/036,696, filed on Dec. 31, 2001, now Pat. No. 6,917,461.

(60) Provisional application No. 60/258,994, filed on Dec. 29, 2000.

(51) Int. Cl.
*G02B 27/14* (2006.01)
*G02B 27/10* (2006.01)
(52) U.S. Cl. .................. 359/636; 359/619; 359/620
(58) Field of Classification Search .......... 359/240, 359/263, 390, 636–640, 690
See application file for complete search history.

(56) References Cited

U.S. PATENT DOCUMENTS

| | | |
|---|---|---|
| 4,306,925 A | 12/1981 | Lebow et al. |
| 4,602,318 A | 7/1986 | Lassen |
| 4,782,028 A | 11/1988 | Farrier et al. |
| 4,827,082 A | 5/1989 | Horiuchi et al. |

(Continued)

FOREIGN PATENT DOCUMENTS

JP    09-199524    7/1997

*Primary Examiner*—Ricky L Mack
*Assistant Examiner*—Brandi N Thomas
(74) *Attorney, Agent, or Firm*—Charles A. Brill; Wade James Brady, III; Frederick J. Telecky, Jr.

(57) ABSTRACT

A system and method of aligning a micromirror array to the micromirror package and the micromirror package to a display system. One embodiment provides a method of forming and utilizing a package that exposes regions of an alignment reference plane. The device within the package is mounted on the reference plane such that the exposed regions allow precise alignment with the device in a direction perpendicular to the reference plane. Alignment surfaces formed in a display system or other system contact the reference plane at the exposed regions to position the packaged device relative to other components of the system. One embodiment of the package 400 taught has laminated layers forming the package substrate 402 and providing a precision reference plane 416 relative to the position of the micromirror device 404. The package may be formed by laminating several layers of material in sheets to form several package substrates simultaneously. Voids formed in the layers 408 on one side of the reference plane provide access to the reference plane. A transparent cover or lid 412 is attached to the package substrate 402 sealing the micromirror 404 in the cavity 410. The preceding abstract is submitted with the understanding that it only will be used to assist in determining, from a cursory inspection, the nature and gist of the technical disclosure as described in 37 C.F.R. §1.72(b). In no case should this abstract be used for interpreting the scope of any patent claims.

3 Claims, 5 Drawing Sheets

U.S. PATENT DOCUMENTS

| | | |
|---|---|---|
| 4,954,480 A | 9/1990 | Imanaka et al. |
| 5,943,212 A | 8/1999 | Horiuchi et al. |
| 6,326,244 B1 | 12/2001 | Brooks et al. |
| 6,350,334 B1 | 2/2002 | Shigemi et al. |
| 6,392,143 B1 | 5/2002 | Koshio |
| 6,664,779 B2 * | 12/2003 | Lopes et al. ............ 324/158.1 |
| 6,827,449 B1 * | 12/2004 | Klonis et al. .................. 353/31 |
| 6,917,461 B2 | 7/2005 | Malone |
| 7,345,807 B2 | 3/2008 | Malone |
| 2002/0068378 A1 | 6/2002 | McLellan et al. |
| 2004/0061492 A1 | 4/2004 | Lopes et al. |

* cited by examiner

LAMINATED MICROMIRROR PACKAGE

This application is a divisional of application Ser. No. 11/159,486, filed Jun. 23, 2005 now U.S. Pat. No. 7,345,807, which is a divisional of application Ser. No. 10/036,696, filed Dec. 31, 2001, now U.S. Pat. No. 6,917,461, which claims the benefit of provisional Application No. 60/258,994, filed Dec. 29, 2000.

FIELD OF THE INVENTION

This invention relates to the field of packaging optical systems, more particularly to alignment of small optical components such as micromirrors, detectors, and reflectors within their packages.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirrors are a type of micromechanical device. Other types of micromechanical devices include accelerometers, pressure and flow sensors, gears and motors. While some micromechanical devices, such as pressure sensors, flow sensors, and micromirrors have found commercial success, other types have not yet been commercially viable.

Micromirrors are primarily used in optical display systems. In display systems, the micromirror is a light modulator that uses digital image data to modulate a beam of light by selectively reflecting portions of the beam of light to a display screen. While analog modes of operation are possible, commercially feasible micromirrors typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the micromirror surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Micromirror arrays used in display systems are small compared to most other technologies. The small array size makes the alignment of the array critical to the performance of the device. A misalignment of only 100 μm shifts the image more than eight image pixels. While this misalignment requires larger, more expensive optics in sequential color systems that use a single micromirror, misalignment can complicate the convergence operation in the larger three-micromirror display systems. The micromirror package are used to align the micromirror array to the display system optics. Not only must the micromirror be precisely aligned relative to the package, the plane of the micromirror must be aligned with the plane of the projection lens to achieve proper focus across the entire micromirror array. What is needed is a method and system of ensuring precise alignment of the micromirror array within a micromirror package.

SUMMARY OF THE INVENTION

Objects and advantages will be obvious, and will in part appear hereinafter and will be accomplished by the present invention which provides a method and system for precision micromirror positioning. One embodiment of the claimed invention provides a method of forming and utilizing a package that exposes discrete regions of an alignment reference plane. The device within the package is mounted on the reference plane such that the exposed regions allow precise alignment with the device in a direction perpendicular to the reference plane. Alignment surfaces formed in a display system or other system contact the reference plane at the exposed regions to position the packaged device relative to other components of the system. For example, a mount may be positioned between a lens and a micromirror device packaged in such a package. The exposed regions of the reference plane would enable simple and accurate alignment of the projection lens with the micromirror allowing the projection lens to obtain a consistent focus across the surface of the micromirror device. Often the mount is sandwiched between the micromirror device and an intervening prism assembly.

Another embodiment of the present invention provides a method of forming a package substrate. The method comprises: providing sheets of substrate layers; forming metalized patterns on at least one of the sheets; laminating the sheets to form the package substrate, the sheets shaped to provide a substrate having a cavity, the cavity having a floor defining a reference plane, wherein the layers are shaped to expose regions of the reference plane outside the cavity.

Another embodiment of the present invention provides a method of packaging a semiconductor device. The method comprising: providing a package substrate having a cavity, the cavity having a floor defining a reference plane, discrete surface regions of the reference plane exposed outside the cavity; attaching a semiconductor device in the cavity of the package substrate; attaching a lid to the package substrate to enclose the device in the cavity.

Another embodiment of the present invention provides a method of aligning a display system. The method comprising: providing positioning structures defining a display system reference plane; aligning a micromirror package with the display system reference plane, the micromirror package having a reference plane defined by regions on a common plane, a micromirror attached to at least one of the regions, the alignment of the micromirror package accomplished by placing at least two of the regions defining the reference plane against the positioning structures; positioning illumination optics relative to the display system reference plane; and positioning projection optics relative to the display system reference plane.

Another embodiment of the present invention provides a package substrate, comprising: a bottom surface; a top surface opposing the bottom surface; a cavity open to the top surface, the cavity having a floor defining a reference plane; and discrete regions outside the cavity exposing a surface of the reference plane.

Another embodiment of the present invention provides a semiconductor device, comprising: a package substrate, the package substrate having a cavity, the cavity having a floor defining a reference plane, discrete regions of the reference plane exposed outside the cavity; a semiconductor device in the cavity of the package substrate; a lid attached to the package substrate enclosing the device in the cavity.

Another embodiment of the present invention provides a display system, comprising: positioning structures defining a display system reference plane; a spatial light modulator package having a reference plane defined by discrete regions on a common plane, a spatial light modulator attached to at least one of the regions, at least two of the regions of the spatial light modulator package against the positioning structures; illumination optics positioned relative to the display system reference plane; and projection optics positioned relative to the display system reference plane.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A method and system for precision micromirror alignment has been developed. The new method and system provide improved alignment of the micromirror device to display system optics. The improved alignment is achieved by exposing portions of a reference layer of the package substrate. When the micromirror is packaged, it is placed on the reference layer. The reference layer is used to position the micromirror relative to the display optics, especially the projection lens. The surface of the same reference layer both supports the micromirror and positions the package relative to the optics. This removes the tolerance build up accumulated by the intervention of package layers formed on top of, or beneath, the reference layer. The removal of this tolerance build-up provides improved control over the back focal length of the projection lens and improves the image focus over the entire surface of the micromirror array.

Figure 1:
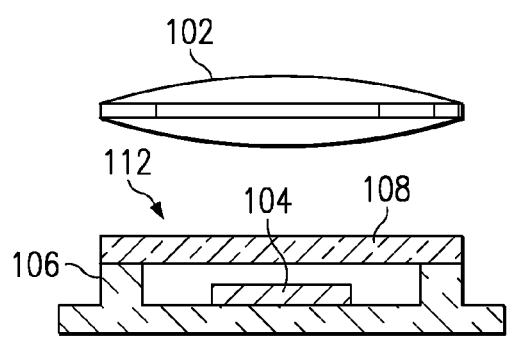
FIG. 1 is a side view of a projection lens with a cross section side view of a packaged micromirror of the prior art.

FIG. 1 is a side view of a projection lens 102 with a cross section side view of a packaged micromirror 104 of the prior art. In FIG. 1, the micromirror 104 is held in a cavity formed in a substrate 106, and covered with a transparent lid 108. The micromirror must be held in a plane parallel to the principal plane of the lens, whether a single lens or a lens system, to achieve optimum focus of the array onto an image plane.

Prior art display systems accomplished alignment of the micromirror array 104 relative to the principal plane of the lens 102 in one of two ways. Either the back surface 110, or bottom surface, of the micromirror package was used as a reference, or the front surface 112, or top surface, was used as to align the device. The surface used was pressed against another component in the display system chassis, and the rest of the optical system was aligned to this other component. For example, many of the micromirror display systems utilize a prism system between the micromirror package and the projection lens. The micromirror package was pressed against the surface of the prism adjacent to the micromirror, or an intervening spacer, to align the micromirror package with the display system optics.

Other prior art method of improving the alignment of the micromirror to the display system optics eliminates at least one source of variance in the alignment of the display system by recessing the entire perimeter of the package. This recess exposes the layer of the package to which the micromirror is attached. Forming the recess allows the system to align to the same layer of the package on which the micromirror is mounted—eliminating the variance in thickness of the upper portion of the package.

Figure 2:
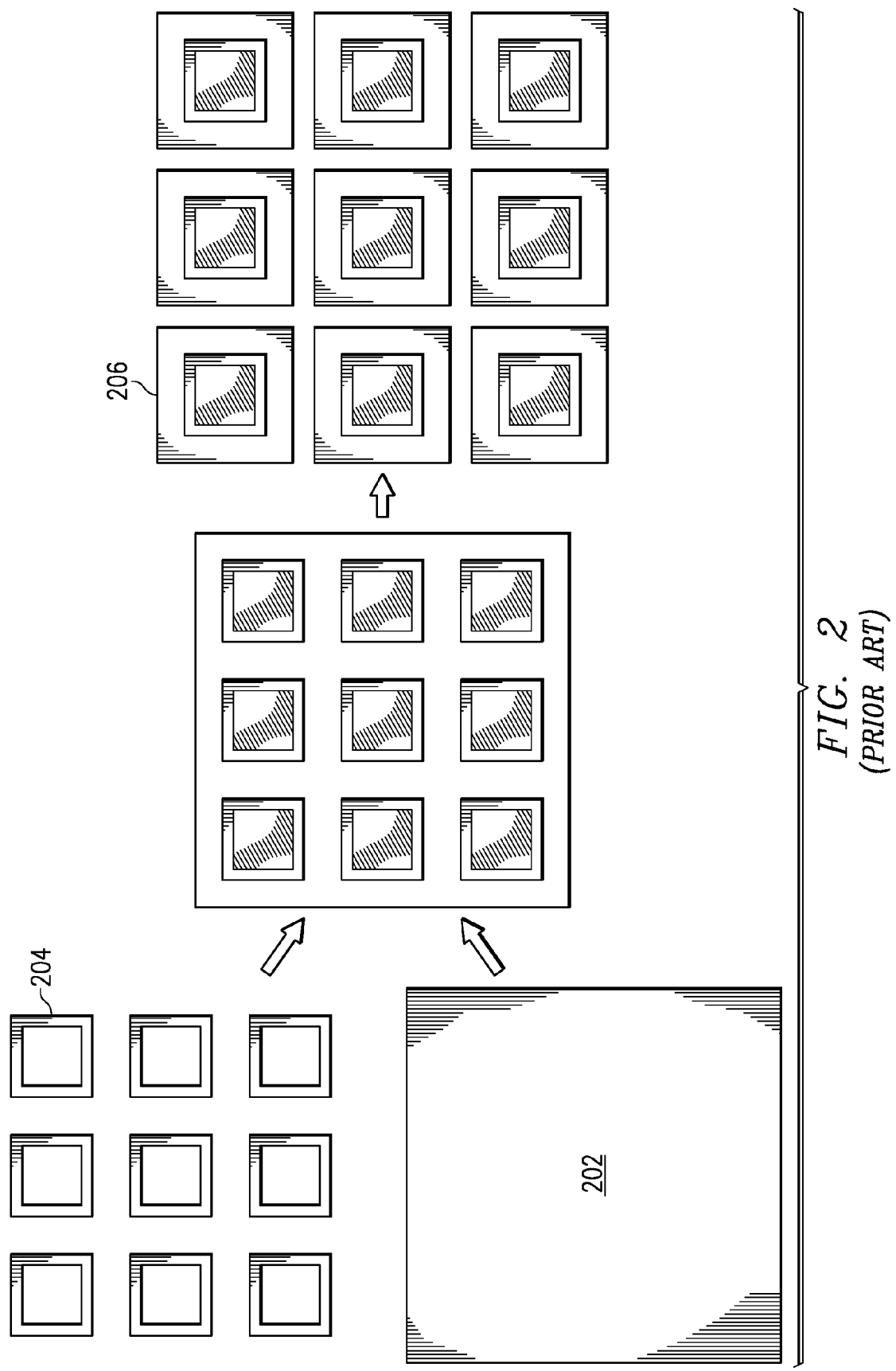
FIG. 2 is a plan view of prior art package layers prior to assembly, after assembly, and after singulation.

FIG. 2 is a plan view of prior art package layers prior to assembly, after assembly, and after singulation. In FIG. 2, the lower package layers are formed in an unfired ceramic sheet 202. The lower package layer sheet 202 typically includes several package layers sandwiching electrical conductors. Top portions 204 of the package are formed and aligned on the lower package layer sheet 202. This assembly is then fired and the individual package substrates 106 are separated from the fired sheet. While this package design improves the alignment of the device, it is expensive to manufacture in large part due to the handling of the top portions 204 of the packages.

Figure 3:
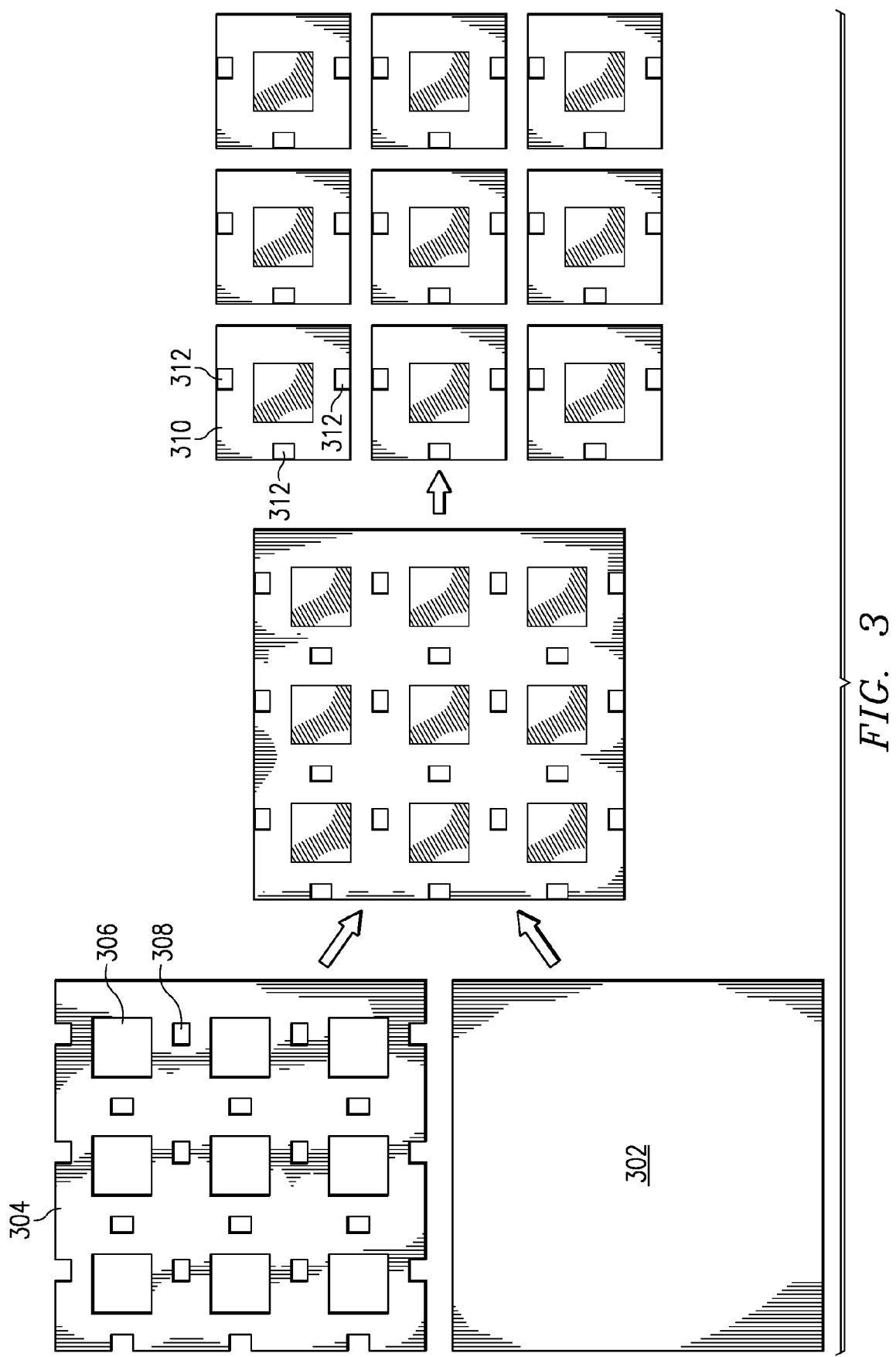
FIG. 3 is a top view of the package layers forming the new package prior to assembly, after assembly, and after singulation.

FIG. 3 is a plan view showing the layers of the new package prior to assembly, after assembly, and after singulation. In FIG. 3, the lower package layers are formed in an unfired ceramic sheet 302. The lower package layer sheet 302 typically includes several package layers sandwiching electrical conductors. A single upper package layer sheet 304 is formed. The upper package layer sheet 304 includes voids 306 that will form the device cavity of the package, and voids 308 that will provide access to the reference plane of the package. The upper package layer sheet 304 is aligned on the lower package layer sheet 302. This assembly is then fired and the individual package substrates 310 are separated from the fired sheet. The package substrate 310 of the present invention, by providing limited recesses 312 to the reference plane rather than access around the entire perimeter of the substrate is much easier and cheaper to manufacture.

Figure 4:
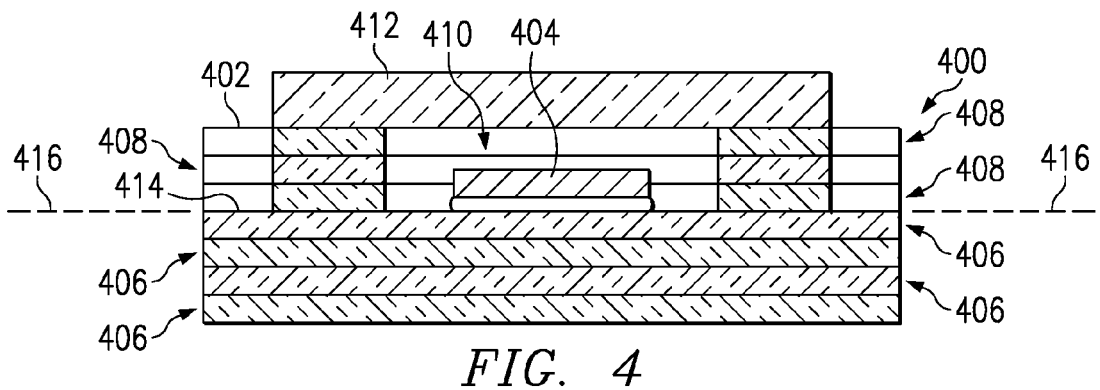
FIG. 4 is a cross section side view of a micromirror package showing the laminated layers forming the package substrate and providing a precision reference plane relative to the position of the micromirror device.

FIG. 4 is a cross section side view of a new micromirror package 400 showing the laminated layers forming the package substrate 402 and providing limited access to a precision reference plane relative to the position of the micromirror device 404. In FIG. 4, the package is formed by laminating seven layers of material. The number of package layers is arbitrary. Packages may have as few as two layers, or as many as are necessary or desirable to form the package. In FIG. 4, the lower four package layers 406 typically include metalization patterns used to interconnect the micromirror array with external circuitry. The layers typically are ceramic and are fired to produce a finished package substrate. Alternatively, the package layers may be plastic. The upper three package layers 408 form a cavity 410 in which the micromirror 404 is held. A transparent cover or lid 412 is attached to the package substrate 402 sealing the micromirror 404 in the cavity 410.

In FIG. 4, the upper three package layers 408 are removed from regions of the package. These regions may be on the perimeter of the device, but do not extend all around the perimeter of the device. The removal of these layers provides access to the upper surface 414 of the lower layers. The upper surface 414 of the lower layers is the reference plane 416 to which the micromirror 404 is attached. In FIG. 4, the reference plane is the interface between the upper layers 408 and the lower layers 406. When installed in a display system, or other optical system, the exposed portions of the reference plane are used to align the micromirror package.

The package of FIG. 4 provides accurate alignment since the alignment features of the display system have direct access to the reference plane of the micromirror package 400. This eliminates any variance in the thickness of the upper layers 408 or in the transparent cover 412 in display systems that align to the transparent cover, or any variance in the lower layers 406 in display systems that align to the bottom surface of the package. In FIG. 4, the only remaining variance between the actual micromirror device and the remainder of the display system is the thickness of the adhesive used to attach the micromirror to the package and any cupping or lack of planarity in the upper surface of the lower layers.

Figure 5:
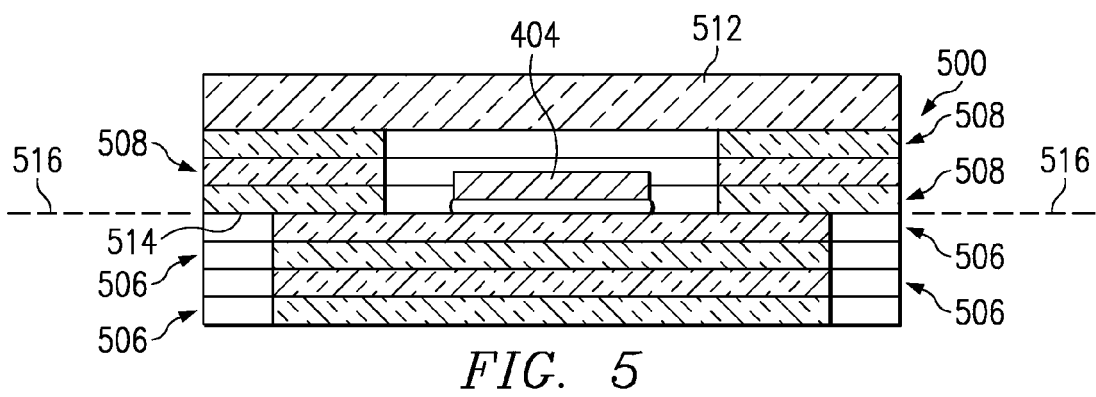
FIG. 5 is a cross section side view of a micromirror package showing the laminated layers forming the package substrate and providing a precision reference plane relative to the position of the micromirror device.

FIG. 5 is a cross section side view of a micromirror package 500 showing the laminated layers forming the package substrate and providing a precision reference plane relative to the position of the micromirror device 404. In FIG. 5, portions of the lower package layers 506 have been removed to expose discrete regions of the lower surface 514 of the upper layers 508. The lower surface 514 of the upper layers is the reference plane. The reference plane again is the interface between the upper layers 508 and the lower layers 506 forming the package substrate. When installed in a display system, or other optical system, the exposed portions of the reference plane are used to align the micromirror package.

The package of FIG. 5 provides a more accurate alignment since the alignment features of the display system have direct access to limited regions of the reference plane 516 of the micromirror package 500. This eliminates any variance in the thickness of the upper layers 508 or in the transparent cover 512 in display systems that align to the transparent cover, or any variance in the lower layers 506 in display systems that align to the bottom surface of the package. In FIG. 5, the only remaining variance between the actual micromirror device and the remainder of the display system is the thickness of the adhesive used to attach the micromirror to the package and any cupping or lack of planarity in the upper surface of the lower layers.

Figure 6:
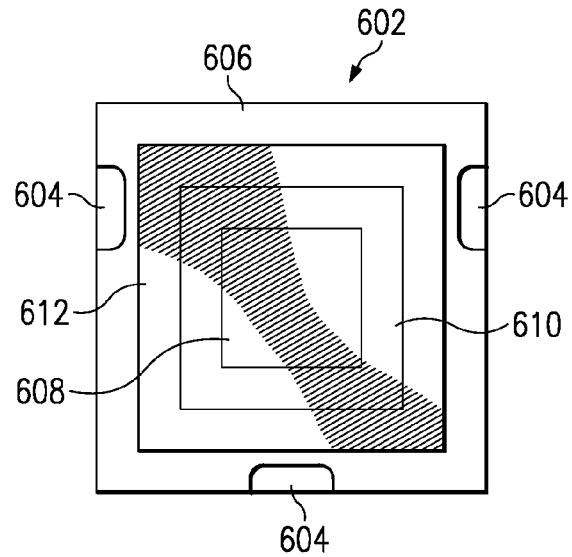
FIG. 6 is a top view of the micromirror package of FIG. 4 showing the location of the reference plane regions around the package of FIG. 4.
Figure 7:
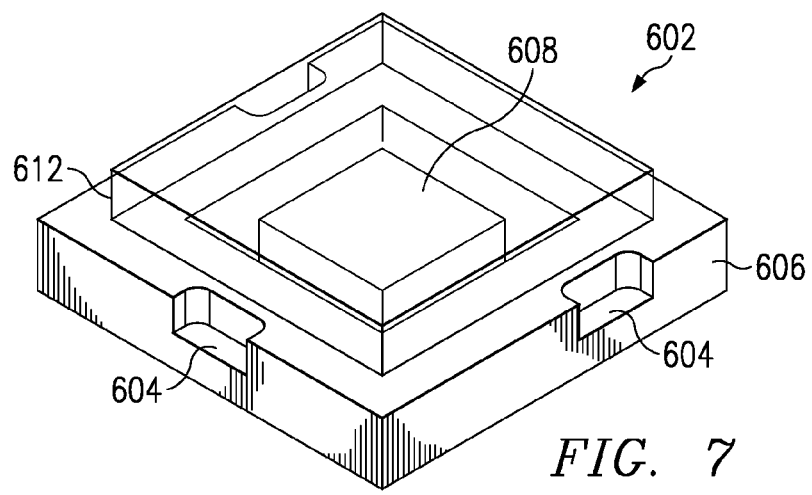
FIG. 7 is a perspective view of the micromirror package of FIG. 6.

FIG. 6 is a top view of the micromirror package 602 similar to that shown in FIG. 4 showing the location of the reference plane regions around the package of FIG. 4. FIG. 7 is a perspective view of the micromirror package 602. In FIGS. 6 and 7, the package is comprised of a substrate 606 holding a micromirror device 608 in a cavity 610 covered by a transparent cover 612.

Several regions 604 are defined around the perimeter of the package 602. These regions 604 provide limited access to the reference plane on which the micromirror is mounted. Typically three regions 604 are defined and used to position the micromirror package, but different numbers of regions can be used. Because the access regions 604 do not extend around the perimeter of the device, manufacture of the present substrate is much less expensive. FIG. 7 is a perspective view of the package of FIG. 6.

These regions 604 are used not only to align the micromirror package to a display system, but also as a reference when mounting the micromirror array in the package. The automated mounting machinery accesses the same regions in the same manner they will be accessed by the display system to ensure a consistent placement of the micromirror array in the package. The use of these reference points ensures the micromirror array is parallel to, and a consistent distance from (due to the thickness of the adhesive), the reference plane.

Figure 8:
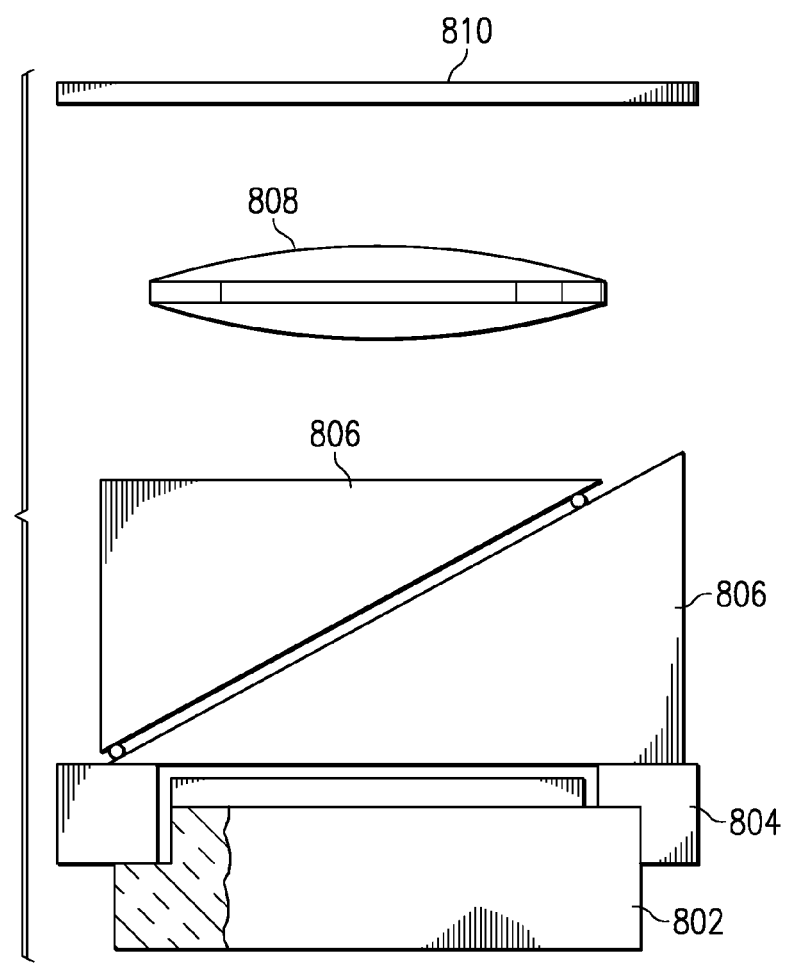
FIG. 8 is a side view of the micromirror package showing the alignment of the micromirror package with the display optics using the regions providing access to the reference plane.

FIG. 8 is a side view of the micromirror package showing the alignment of the micromirror package 802 with the display optics using the regions providing access to the reference plane. In FIG. 8, a mount 804 spaces the micromirror package 802 apart from a prism assembly 806. The mount 804 contacts the exposed regions of the reference plane and the prism assembly to provide precise spacing between the micromirror array held by the package and the prism assembly. The spacing between the micromirror array and the prism assembly is consistent across the surface of the micromirror array. The display system chassis hold the projection lens 808 in alignment with the prism assembly 806 allowing the projection lens 808 to form a well focused image of the micromirror array on the image plane 810.

Figure 9:
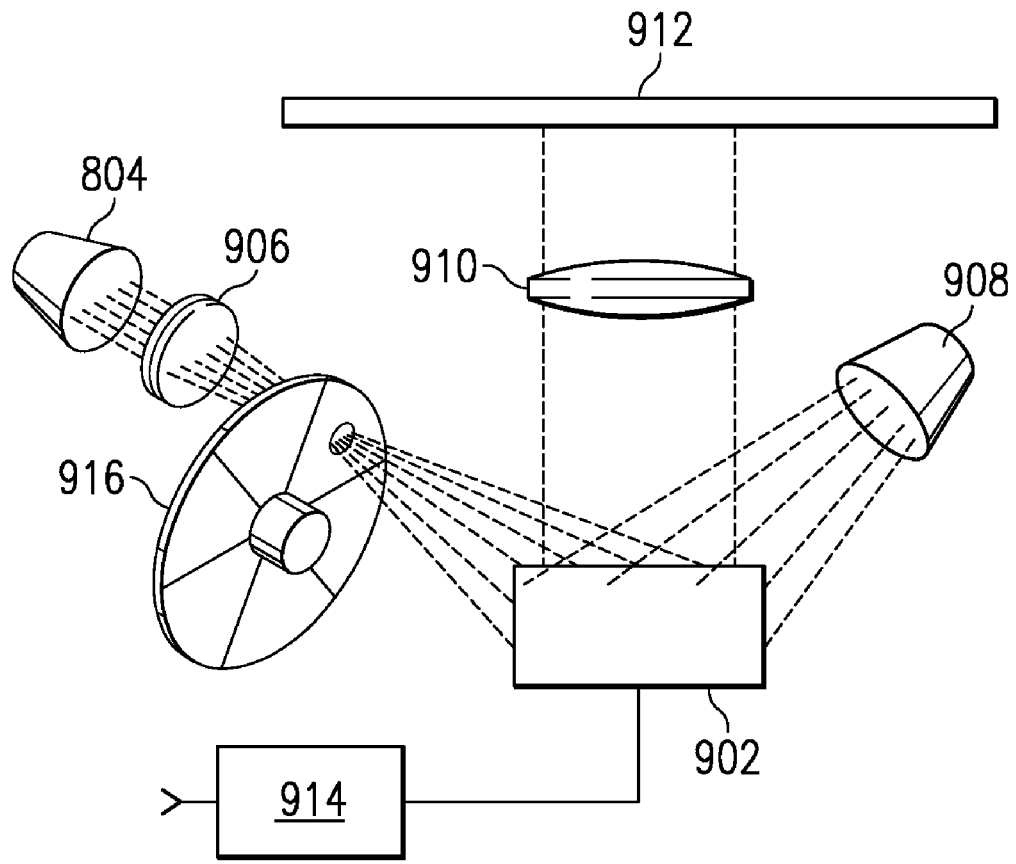
FIG. 9 is a schematic view of a display system using the improved package according to the present invention.

FIG. 9 is a schematic view of a display system using the improved package according to the present invention. In FIG. 9, light from light source 904 is focused on the improved micromirror 902 by lens 906. Although shown as a single lens, lens 906 is typically a group of lenses and mirrors which together focus and direct light from the light source 904 onto the surface of the micromirror device 902. As shown in FIG. 9, a color wheel 916, or another color splitting mechanism such as a color splitting prism is used to separate a beam of white light into separate primary colored light beams.

Image data and control signals from controller 914 cause some mirrors in the array to rotate to an on position and others to rotate to an off position. Mirrors on the micromirror device that are rotated to an off position reflect light to a light trap 908 while mirrors rotated to an on position reflect light to projection lens 910, which is shown as a single lens for simplicity. Projection lens 910 focuses the light modulated by the micromirror device 902 onto an image plane or screen 912.

Figure 10:
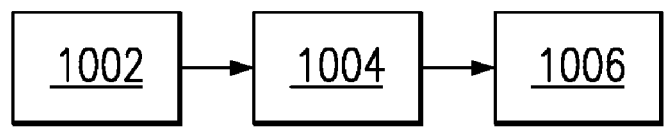
FIG. 10 is a flow chart showing a method of forming a package substrate.

FIG. 10 is a flow chart showing a method of forming a package substrate. In block 1002, substrate layers are provided. The layers typically are an unfired ceramic composition, often having metal layers on one or both surfaces. In block 1004, metalized patterns are formed on the substrate layers. The metalized patterns typically are formed by removing the bulk of the metalization so that only the regions forming the electrical interconnects remain. The layers are then laminated, or stacked on top of each other, in block 1006 and cured to produce a finished package substrate. The curing process typically involves firing the laid-up ceramic layers.

At some point, typically prior to curing the package substrate, the layers are shaped to create voids that will expose the reference plane when the package substrate is completed. The voids may be formed when the layers are first created, or may be formed later in the process. The voids occur in the layers on one side of the reference plane to provide access to the reference plane from that side—either the top or the bottom of the package. Likewise, some of the layers typically also contain a void to form the package cavity into which the device being packaged will be placed.

Figure 11:
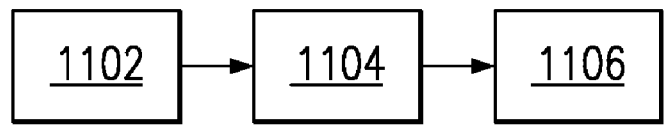
FIG. 11 is a flow chart showing a method of packaging a semiconductor device.

FIG. 11 is a flow chart showing a method of packaging a semiconductor device. A package substrate is provided in block 1102. The package substrate has a cavity with a floor. The floor is a flat surface that defines a reference plane for the package. Outside of the cavity portion of the package substrate, regions of the reference plane are exposed—that is, regions of the package outside the cavity are formed with surfaces coplanar to the floor of the cavity. The regions may be exposed to either the top or bottom side of the package substrate. Alternatively, some regions may be exposed to the top side while others are exposed to the bottom side of the package substrate.

A semiconductor device is attached to the package substrate cavity in block 1104. The semiconductor device often is some type of electro-optical device that requires precise alignment with objects outside the package. Typically the device is a micromirror device that requires precision alignment between the micromirror device an optical components outside the micromirror package.

After the semiconductor device is attached to the cavity, a lid is attached to enclose the device in the package cavity as shown in block 1106. The lid typically is a piece of glass. The lid may be glued to the package substrate—which provides a semi-hermetic seal—or mounted in a kovar or other frame and brazed to the remainder of the package.

The package described above improves the alignment of various display system components to the micromirror device packaged in the improved package. In display systems in which the micromirror array is imaged onto an image plane, it is critical that the array and the principal plane of the projection lens are parallel so that the micromirror array can be properly focussed across the entire face of the array.

Alignment within the display system typically is provided by mating optical components to each other, or to fixed features molded into the display chassis. The location of these features is determined by the assumed position of the micromirror array. Prior art systems used the top or bottom of the micromirror package and assumed a known offset from the face of the array. Unfortunately, each layer of the package adds to the variability of the package. Thus, if there are two ceramic layers forming the walls of the package cavity, each of the layers adds variability to the distance between the face of the package and the face of the spatial light modulator.

The disclosed package eliminates this source of variability by providing access to the same plane on which the micromirror is attached. This access allows other components, such as the mount of FIG. 8 or features of the system chassis, to make mechanical contact with the reference plane, typically via protrusions engaging the reference regions.

A display system is aligned using the disclosed invention by defining a display system reference plane to which all of the illumination optics, projection optics, and the modulator will be aligned. Positioning structures are provided to contact regions of the modulator reference plane that are exposed. Placing the modulator against these positioning structures aligns the modulator to the structures. The illumination optics and projection optics are then positioned relative to the positioning structures. The optics are positioned either directly, as is the case when a mount having the positioning structures is held between the modulator and a prism, or indirectly when a series of alignment features are formed in a display system chassis and each of the features aligns a particular item.

Thus, although there has been disclosed to this point a particular embodiment for precision micromirror positioning and method therefore, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. §112, paragraph six.

What is claimed is:

1. A method of aligning a display system, the method comprising:
   providing positioning structures defining a display system reference plane;
   aligning a micromirror package with said display system reference plane, said micromirror package having a reference plane defined by regions on a common plane, a micromirror attached to at least one of said regions, said alignment of said micromirror package accomplished by placing at least two of said regions defining said reference plane against said positioning structures;
   positioning illumination optics relative to said display system reference plane; and
   positioning projection optics relative to said display system reference plane.

2. The method of claim 1, wherein said illumination optics comprises a prism, said aligning a micromirror package and said positioning illumination optics comprising:
   positioning said micromirror package against a mount, said mount contacting said regions on said micromirror package reference plane; and
   positioning said prism against said mount.

3. A method of aligning an optical system, the method comprising:
   providing positioning structures defining an optical system reference plane;
   aligning a optical device package with said optical system reference plane, said optical device package having a reference plane defined by regions on a common plane, an optical device attached to at least one of said regions, said alignment of said optical device package accomplished by placing at least two of said regions defining said reference plane against said positioning structures; and
   positioning optics relative to said optical system reference plane.

* * * * *